United States Patent [19]

Nakayama

[11] 4,186,551
[45] Feb. 5, 1980

[54] ELECTRONIC TIMEPIECE STRUCTURE

[75] Inventor: Yasuaki Nakayama, Hanno, Japan

[73] Assignee: Citizen Watch Co., Ltd., Tokyo, Japan

[21] Appl. No.: 892,403

[22] Filed: Apr. 3, 1978

Related U.S. Application Data

[63] Continuation of Ser. No. 675,637, Apr. 9, 1978, abandoned.

[51] Int. Cl.² .............................................. G04C 3/00
[52] U.S. Cl. .................... 58/23 R; 58/23 D; 29/626
[58] Field of Search ............... 58/23 R, 23 D, 50 R; 29/626, 628; 310/40 MM, 43, DIG. 6, 179, 194, 68 D, 68; 174/68.5

[56] References Cited

U.S. PATENT DOCUMENTS

| 2,893,150 | 7/1959 | Tann | 174/68.5 |
| 2,912,481 | 11/1959 | Backus et al. | 29/626 X |
| 3,590,480 | 7/1971 | Johnson et al. | 29/626 X |
| 3,778,999 | 12/1973 | Vuffray | 58/23 R |
| 3,803,433 | 4/1974 | Ingenito | 58/23 D |
| 3,842,585 | 10/1974 | Lupoli | 58/23 R |
| 3,898,789 | 8/1975 | Arzi e al. | 58/23 R |
| 3,912,852 | 10/1975 | Simon | 29/626 X |
| 3,943,695 | 3/1976 | Bauer et al. | 58/23 D |
| 3,981,139 | 9/1976 | Jackle | 58/23 R |
| 4,012,899 | 3/1977 | Matsuura et al. | 58/23 D |

Primary Examiner—Ulysses Weldon
Attorney, Agent, or Firm—Koda and Androlia

[57] ABSTRACT

A compact electronic timepiece structure for a timepiece having an analog type display wherein the electromechanical transducer for the display and the circuit board for the electronics of the timepiece are combined into a single joint structure. The joint structure comprises an arcuous coil member wound on an insulative bobbin, a circuit board for supporting the electronic components and electrical interconnects between the components, a plurality of holes in the circuit board, and a plurality of thermoplastic fastening means extending through the holes of the circuit board and fastening the bobbin to the circuit board.

8 Claims, 4 Drawing Figures

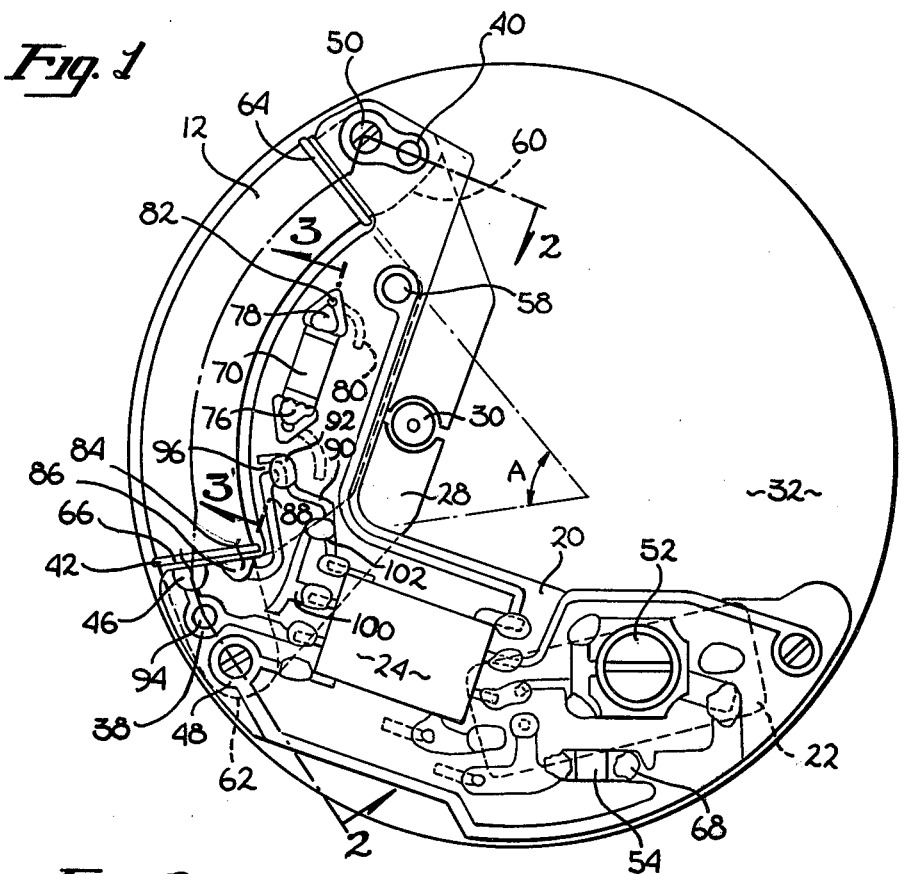

ELECTRONIC TIMEPIECE STRUCTURE

This is a continuation of application Ser. No. 675,637 filed Apr. 9, 1978 now abandoned.

BACKGROUND OF THE INVENTION

1. Field of Invention

This invention relates to electronic timepieces utilizing electromechanical transducers and more particularly to a joint structure for the coil portion of the transducer and the circuit board for the electronic components.

2. Prior Art

In the prior art, the coil portion of the electromechanical transducer and the circuit board are manufactured separately for electronic timepieces having analog type displays. During assembly the coil portion of the electromechanical transducer is electrically coupled to the circuit board by means of contact springs. This structure however suffers from several shortcomings. One of such shortcomings is that it requires a relatively large space. Another such shortcoming is that the electrical connection through the spring contacts is not reliable over long periods of time.

SUMMARY OF THE INVENTION

Accordingly, it is a general object of the present invention to provide a joint structure of the coil portion of the electromechanical transducer and the circuit board for electronic watches which is compact and has a high reliability.

It is another object of the present invention to provide a joint structure which is suitable for quality control inspections during assembly and which is easily assembled by automatic machinery.

It is still another object of the present invention to provide a method for joining the coil portion of a transducer to the circuit board for an electronic watch.

In keeping with the principals of the present invention, the objects are accomplished by the unique joint structure comprising an arcuous coil member wound up on an insulative bobbin, a circuit board for supporting the electronic components, a plurality of holes in the circuit board, and a plurality of thermoplastic fastening means extending through the holes in the circuit board and fastening the coil member thereto. In one embodiment the thermoplastic fastening means may be formed integrally with the bobbin thereby eliminating the need of a separate component. In another embodiment of the present invention the thermoplastic fastening means comprises a separate component which extends through holes in both the circuit board and the coil member. Furthermore, the circuit board is provided with checking spaces for determining the quality of the timepiece as it is being assembled and which are closed by solder and the like during the assembly process.

BRIEF DESCRIPTION OF THE DRAWINGS

The above mentioned and other features and objects of the present invention will become more apparent by reference to the following description taken in conjunction with the accompanying drawings wherein like reference numerals denote like elements, and in which:

FIG. 1 is a plan view of a watch structure in accordance with the teachings of the present invention;

FIG. 2 is a cross section of the embodiment of FIG. 1 taken along the lines 2—2 of FIG. 1;

FIG. 3 is a cross sectional view of the embodiment of FIG. 1 taken along the lines 3—3 of FIG. 1; and FIG. 4 is a partial view of another embodiment of the electronic timepiece structure shown in enlarged cross section.

DETAILED DESCRIPTION OF THE INVENTION

Referring to FIGS. 1 and 2, shown therein is an embodiment of the joint structure for an electronic timepiece having an analog type display. The joint structure includes a coil member 12. The coil member 12 comprises a wire wound coil 14, a bobbin 16 made of thermoplastic material onto which coil 14 is wound, and a magnetic core 18 made of a magnetic permeable material. Core 18 comprises a portion of the magnetic circuit for the electromechanical transducer.

Circuit board 20 is made of an epoxy sintered paper substrate plated with copper. Crystal oscillator 22 and CMOS integrated circuit (IC) 24 are provided on circuit board 20.

Yokes 26 and 28 comprise another portion of the magnetic circuit of the electromechanical transducer. Yokes 26 and 28 are made of a high magnetic permeable material similar to that utilized for core 18. Rotor 30 is installed between yokes 26 and 28 and is supported by bridge (not shown) and pillar plate 32. Rotor 30 is a permanent magnet and yokes 26 and 28, rotor 30 and coil member 12 form the electromechanical transducer, i.e., motor. Mounting bushings 34 and 36 are provided in pulse pillar plate 32.

Bobbin 16 is provided with two projections 38 and 40 extending upwardly through openings in board 20. Since projections 38 and 40 are made of a thermoplastic, coil 12 is riveted to circuit board 20 by the application of heat to projections 38 and 40. The end portion 42 of wire coil 14 is then soldered to conductive point 44 on circuit board 22. In other words, coil member 12 is fixed to circuit board 20 via thermoplastic projections 38 and 40 so as to form a single structure whereby the magnetic circuit of electromechanical transducer as well as the electronic circuit may be incorporated together by fixing the single structure comprising the coil member 12 and circuit board 20 onto plate 32 with screws 48 and 50 threaded into bushings 34 and 36. Screws 48 and 50 project through holes in laterally extending projections which project from protecting portions on the bobbin 16.

In FIGS. 1-3 temperature compensating condenser 54, oscillator stabilizing resistor 56 and reset pin 58 which together with a lever (not shown) constitutes a switch means are all installed upon circuit board 20 to form a single unit together with coil member 12.

It should be pointed out at this time that the angle A between frames 64 and 66, which hold the coil member 12 at each end thereof, is preferably set to as small an angle as possible so that the undesirable difference in the inside and outside dimensions of the coil may be reduced to a certain degree. If the inside and outside dimensions of the coil member 12 are differ greatly, coil member 12 will be thicker on the inside than on the outside and will result in an increase in the amount of space required for the coil member 12.

In practice condenser 54 is made of barium titanite and is to compensate for temperature changes that affect the frequency of crystal oscillator 22. Furthermore, condenser 54 is fixed to circuit board 20 with a conductive adhesive agent 68 such as epoxy resin mixed with silver, instead of soldering. Since the heat of soldering would cause aging of condenser 54 and result in changes in the dielectric constant, the frequency stability of the crystal oscillator would be adversely affected. Frequency stabilizing resistor 70 is provided adjacent coil member 12 on circuit board 20 and is fixed to circuit board 20 with a conductive adhesive agent at joints 76 and 78 thereof. Resistor 70 is made by printing a thick film 74 upon a ceramic substrate 72 to form a resistor chip. The resistor chips are sorted into different resistance values and resistor 70 is selected to meet the specific resistance requirements to limit the power consumption of the oscillator. Resistor 70 is electrically connected to the circuit pattern 80 of circuit board 20 by means of a conductive adhesive agent which extends from joints 76 or 78 through openings 82 to pattern 80 on the underside of circuit board 20. Besides the reason previously stated, a conductive adhesive agent is utilized to connect condenser 54, resistor 70, and the other components of the electronic watch to the electrical circuit on the circuit board 30 because the conductive adhesive agent provides a stronger yet smaller joint than solder and provides a simpler process for making a connection which is more suited for automatic manufacturing than solder.

A space 92 is provided between electrical lead pattern 88 to which end 84 of wire coil 14 of coil member 12 is electrically coupled by solder joint 86 and electrical lead pattern 90 to which one lead of is coupled. Electrical leads pattern 88 and 90 are coupled together solder joint 96 thereby coupling coil member 12 and CMOS IC 24 together. The other end of wire coil 14, coil member 12 is coupled to CMOS IC 24 through electrical lead pattern 94. Since it is generally desirable to make the coil member 12 as compact as possible and having as low a power consumption as possible, the wire utilized to wind wire coil 14 is exceedingly small and may be easily broken. Therefore it is not a recommended procedure to examine the coil member 12 before it is incorporated into the circuit board 20. Accordingly, the whole process of construction is simpler and more suited for automatic manufacturing if the CMOS IC 24, crystal oscillator 52, the other electronic components and coil member 12 are checked at one time rather than checked separately before assembly. Furthermore, the probability of a break in wire coil 14 will not be very high if coil member 12 is carefully constructed. Therefore, the examination of coil member 12 as well as resistor 70 can be efficiently and preferably done after most of the components are incorporated into circuit board 20 and the ends of coil member 12 are soldered. According to the present invention, since coil member 12 is electrically isolated from CMOS IC 24 by space 92 before solder joint 96 is applied, coil member 12 may be checked through lead patterns 90 and 94 with being affected by or affecting CMOS IC 24. After coil member 12 has been examined electrical lead patterns 88 and 90 are joined together by placing a small copper disc 98 coated with solder/onto circuit board 12 and covering disc 98 with a solder joint 96 by heating/thereby providing an electrical coupling between lead patterns 88 and 90. To complete the assembly lead pattern 100 is coupled to lead pattern 90 by applying solder over a space 102 formed between patterns 100 and 90.

Referring to FIG. 4, shown therein is another embodiment of a means to fix coil member to the circuit board 120. The coil (not shown) supported by a bobbin 116 is fixed to circuit board 120 through magnetic core 118 which is fastened to circuit board 120 by a rivet 110 made of a thermoplastic material such as nylon. Since the rivet 110 is made from a plastic material it will not adversely affect the magnetic qualities of coil 118.

According to the present invention as described above, since the coil is firmly supported by the circuit board and the wire ends are directly coupled to the lead patterns on the circuit board by soldering, it is possible to use a relatively heavier and more reliable coil member. Moreover, it is unnecessary to handle the coil separately during assembly since the major components such as the circuit board and the coil member are contained in a single structure which is fixed to the base plate 32. Since it is unnecessary to handle the coil separately, undesirable breakage of the coil wire 14 is less likely to happen and therefore a protective means for coil member 12 may be omitted thereby reducing the required space for the coil member 12. In addition, this invention also allows for examination of the coil at some final assembly step thereby reducing the incidence of inferior products.

In all cases it is understood that the above described embodiments are merely illustrative of but a small number of many possible specific embodiments which represent the applications of the principals of the present invention. Furthermore, numerous and varied other arrangements can be readily devised in accordance with the principals of the present invention by those skilled in the art without departing from the spirit and scope of this invention.

I claim:

1. A structure for a quartz wrist watch of the type comprising a pillar plate, a motor and a circuit board having an electrical lead pattern formed thereon provided superjacent said pillar plate and a stator of said motor provided on said plate comprising a yoke, a core provided adjacent said yoke and a bobbin provided about said core having wire wound around, said structure being characterized by:
    said yoke being fixed to said plate;
    said bobbin being subjacent said circuit board and superjacent said pillar plate, said bobbin further being fixed directly to a lower surface of said circuit board;
    said wire wound on said bobbin being extended directly to and electrically coupled to said electrical lead pattern; and
    a fastening means for magnetically and mechanically coupling said yoke to said core and for positioning said circuit board on said plate, said means being a removable screw.

2. A structure according to claim 1, wherein said bobbin is made of a thermo plastic material and said bobbin is formed with rivets thereon whereby said bobbin is fixed to said circuit board by treating said rivets with heat.

3. A structure according to claim 2, wherein said core comprises a first magnetic plate and said yoke comprises a pair of second magnetic plates, said pair of second magnetic plates being provided above and in contact with said pillar plate and in magnetic contact with said first plate whereby since said bobbin is fixed to the lower surface of said circuit board, said bobbin fixes the space in between said pillar plate and said circuit board at a desired spacing.

4. A structure according to claim 3, wherein said electrical lead pattern is in the form of a temporarily incomplete circuit thereby allowing said pattern and said coil member to be inspected without having an adverse effect upon each other.

5. A structure according to claim 4, wherein said temporarily incomplete lead pattern circuit is completed utilizing electrical bridges made of copper covered with solder.

6. A structure for an electronic timepiece according to claim 5, comprising at least one electrical through hole connection to said lead pattern being formed by an adhesive agent comprising epoxy resin mixed with silver.

7. In a watch module construction for a quartz crystal wrist watch having a crystal oscillator, an integrated circuit, and an electromechanical transducer having yokes, the improvement comprising:
  a circuit board on which said crystal oscillator and said integrated circuit are supported, and
  a pillar plate on which said yokes are supported, said electromechanical transducer including a core extending parallel to said pillar plate and magnetically connected to said yokes, a coil member provided around said core, and a bobbin made of a thermoplastic material, said bobbin including protecting portions formed at both ends of said coil member, and laterally extending projections projecting from said protecting portions in parallel to said pillar plate, said laterally extending projections being mounted on said pillar plate through said yokes, respectively, and fixedly secured to said pillar plate, said laterally extending projections having vertical projections vertically projecting from said laterally extending projections; and said circuit board having bores through which said vertical projections extend and ends of said vertical projections are heat treated to firmly hold said circuit board in a fixed position such that bobbin is subjacent said circuit board and fixed directly to a lower surface of said circuit board.

8. A structure for a quartz wrist watch of the type comprising a pillar plate, a motor and a circuit board having an electrical lead pattern formed thereon provided superjacent said pillar plate and a stator of said motor provided on said plate comprising a yoke, a core provided adjacent said yoke and a bobbin provided about said core having wire wound around, said structure being characterized by:
  said circuit board having a crystal oscillator and integrated circuit coupled to and supported thereon, and
  said pillar plate supporting said yokes, said core standing parallel to said pillar plate and magnetically connected to said yokes and said bobbin being made of a thermoplastic material, said bobbin including protecting portions formed on both ends of said bobbin and laterally extending projections projecting from said protecting portions in parallel to said pillar plate, said laterally extending projections being mounted on said pillar plate through said yokes, respectively, and fixedly secured to said pillar plate, said laterally extending projections having vertical projections vertically projecting from said laterally extending projections; and said circuit board having bores through which said vertical projections extend and ends of said vertical projections are heat treated to firmly hold said circuit board in a fixed position such that said bobbin is subjacent said circuit board and fixed directly to a lower surface of said circuit board.

* * * * *